United States Patent
Gottin et al.

(10) Patent No.: US 11,004,025 B1
(45) Date of Patent: May 11, 2021

(54) SIMULATION-BASED ONLINE OPTIMIZATION OF WORKFLOWS

(71) Applicant: EMC IP Holding Company LLC, Hopkinton, MA (US)

(72) Inventors: Vinícius Michel Gottin, Rio de Janeiro (BR); Angelo E. M. Ciarlini, Rio de Janeiro (BR); Jonas F. Dias, Rio de Janeiro (BR); Daniel Sadoc Menasché, Rio de Janeiro (BR); Alex L. Bordignon, Niterói (BR); Fábio A. M. Porto, Petrópolis (BR)

(73) Assignee: EMC IP Holding Company LLC, Hopkinton, MA (US)

( * ) Notice: Subject to any disclaimer, the term of this patent is extended or adjusted under 35 U.S.C. 154(b) by 261 days.

(21) Appl. No.: 15/800,587

(22) Filed: Nov. 1, 2017

(51) Int. Cl.
*G06Q 10/06* (2012.01)
*G06N 20/00* (2019.01)
*G06F 30/20* (2020.01)

(52) U.S. Cl.
CPC ......... *G06Q 10/0633* (2013.01); *G06F 30/20* (2020.01); *G06N 20/00* (2019.01)

(58) Field of Classification Search
CPC .................................................. G06Q 10/06
See application file for complete search history.

(56) References Cited

U.S. PATENT DOCUMENTS 9,646,117 B1* 5/2017 Kotzabasakis ..... G06Q 10/0633
2009/0007063 A1* 1/2009 Szpak .................... G06F 8/10
  717/105
2011/0252427 A1* 10/2011 Olston .................. G06F 16/951
  718/102

(Continued)

OTHER PUBLICATIONS

Dutreith, X, et al., "Using reinforcement learning for autonomic resource allocation in clouds: towards a fully automated workflow," ICAS the 7th International Conference on Autonomic and Autonomous Systems (2011).

(Continued)

*Primary Examiner* — Kurtis Gills
(74) *Attorney, Agent, or Firm* — Ryan, Mason & Lewis, LLP

(57) ABSTRACT

Techniques are provided for simulation-based online workflow optimization. One method comprises obtaining a state of concurrent workflows; obtaining state similarity functions that assign a similarity score between pairs of states; generating a simulation model of the workflow executions representing different configurations of at least one control variable in the workflow executions by mapping states with a highest similarity; obtaining at least one utility function that assigns a utility score to the states in the simulation model; determining a configuration of the control variable that maximizes the utility score for states in the simulation model; and for new concurrent workflows: obtaining a current state of the new concurrent workflows; identifying a most similar state with one of the determined configurations of the control variable in the simulation model with a highest similarity to the current state; and adjusting the configuration of the control variable of the new concurrent workflows to match the corresponding configuration of the control variable of the most similar state.

20 Claims, 13 Drawing Sheets

(56) References Cited

U.S. PATENT DOCUMENTS

| | | | | |
|---|---|---|---|---|
| 2016/0063145 | A1* | 3/2016 | Chang | H04L 65/403 |
| | | | | 703/6 |
| 2016/0224910 | A1* | 8/2016 | Deng | G06Q 30/016 |
| 2017/0177331 | A1* | 6/2017 | Howard | G06F 16/245 |
| 2017/0269971 | A1* | 9/2017 | Anya | G06F 17/241 |

OTHER PUBLICATIONS

Tesauro, G., "Reinforcement Learning in Autonomic Computing: A Manifesto and case studies," ieee Internet Computing (2007).

Wang, J., et al., "Workflow as a service in the cloud: architecture and scheduling algorithms," Procedia Computer Science, pp. 546-556, (2014).

U.S. Appl. No. 14/580,732, "Method and Apparatus for Analytical Processing of Provenance Data for HPC Workflow Optimization", filed Dec. 23, 2014.

U.S. Appl. No. 15/364,449, "Snapshots to Train Prediction Models and Optimize Workflow Execution", filed Nov. 30, 2016.

\* cited by examiner

(1) DETERMINE APPROPRIATE UTILITY FUNCTIONS FOR INTENDED OPTIMIZATION;

(2) START EXECUTION OF A BATCH OF WORKFLOWS;

(3) SELECT ONE OR MORE APPROPRIATE PREPROCESSED ENDOGENOUS STATE SPACES, REPRESENTING PREVIOUS EXECUTIONS OF SIMILAR WORKFLOWS, OVER WHICH THE APPROPRIATE UTILITY FUNCTIONS HAVE BEEN PREPROCESSED;

(4) UNTIL BATCH COMPLETES, a. COLLECT INSTANTANEOUS PROVENANCE AND TELEMETRY INFORMATION OF CURRENT BATCH EXECUTION;

b. COMPOSE SNAPSHOTS FROM COLLECTED PROVENANCE DATA, COMPRISING A CURRENT STATE;

c. APPLY EXOGENOUS STATE-MAPPING FUNCTION OVER CURRENT STATE, PRODUCING SUBSTANTIALLY MOST-SIMILAR STATE IN ENDOGENOUS STATE SPACE GRAPH(S);

d. ELECT SUBSTANTIALLY BEST ACTION TO BE PERFORMED IN CURRENT EXECUTION, LEVERAGING PREPROCESSED UTILITY FUNCTIONS FOR SUBSTANTIALLY MOST-SIMILAR STATE; AND e. ENACT THE SUBSTANTIALLY BEST ACTION.

US 11,004,025 B1

SIMULATION-BASED ONLINE OPTIMIZATION OF WORKFLOWS

FIELD

The field relates generally to managing execution of a workflow in a workflow environment.

BACKGROUND

Workflows are an important building block of modern industrial systems. Typically, scientific and business workflows are instrumented by means of workflow management systems. Many of these workflows are automated, comprising the execution of a number of tasks to achieve a goal determined by the end-user, and are often of large complexity, and/or dealing with large volumes of data.

As new Artificial Intelligence and Big Data applications emerge, the level of business automation is dramatically increasing. These applications are fast becoming more and more interconnected, leading to new complex workflows executed with real-time requirements, such as those observed in Internet-of-Things environments. In typical applications, workflows demand large amounts of distributed computing resources. Providing scalability and elasticity for these workflows, either on-premises or in the cloud, is often necessary, in order to save costs. On the other hand, making sure that all Quality of Service requirements are met is far from trivial. In this manner, workflow management and orchestration tend to become a crucial building block to make modern systems of almost all industries economically efficient.

A need exists for improved techniques for optimizing workflow executions.

SUMMARY

In one embodiment, a method is provided for simulation-based online optimization of workflows. An exemplary method comprises obtaining a state of one or more workflow executions of a plurality of concurrent workflows in a shared infrastructure environment, wherein the state comprises a plurality of provenance features of the concurrent workflows; identifying one or more control variables from the plurality of provenance features; obtaining a definition of one or more state similarity functions which assign a similarity score between pairs of states; generating a simulation model of the one or more workflow executions representing a plurality of different configurations of at least one of the control variables in the one or more workflow executions of the concurrent workflows by mapping states with a substantially highest similarity given by the one or more state similarity functions; obtaining at least one utility function that assigns a utility score to one or more of the states in the simulation model; determining a configuration of the at least one control variable that substantially maximizes the utility score for one or more states in the simulation model; performing the following steps, in response to a real-time execution of a plurality of new concurrent workflows: collecting instantaneous provenance features of the new concurrent workflows; obtaining a current state of the real-time execution comprised of the instantaneous provenance features; identifying a substantially most similar state with one of the determined configurations of the at least one control variable in the simulation model with a substantially highest similarity to the current state given by the one or more state similarity functions; and adjusting the configuration of the at least one control variable of the real-time execution to substantially match the corresponding configuration of the at least one control variable of the substantially most similar state.

Other illustrative embodiments include, without limitation, apparatus, systems, methods and computer program products comprising processor-readable storage media.

BRIEF DESCRIPTION OF THE DRAWINGS

FIG. 10 illustrates exemplary pseudo code for an online workflow optimization process, according to one embodiment of the disclosure;

DETAILED DESCRIPTION

Figure 1:
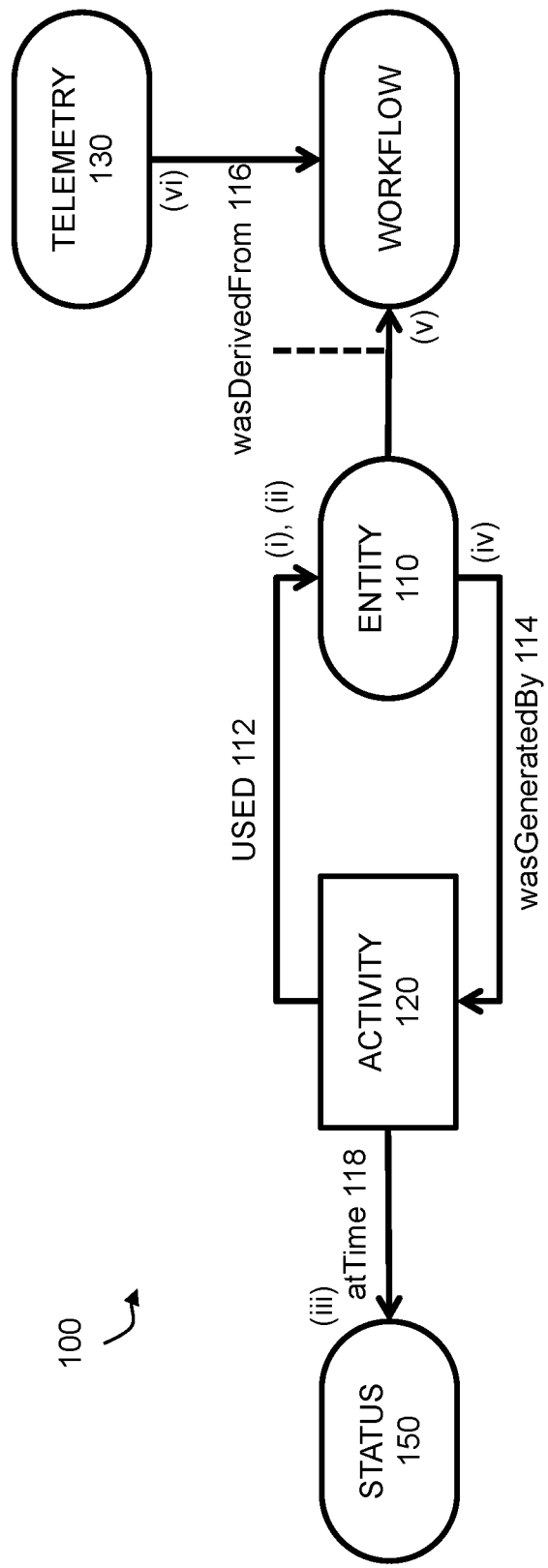
FIG. 1 illustrates the relationships between elements in a provenance graph for a workflow, according to one embodiment of the invention.

Illustrative embodiments of the present disclosure will be described herein with reference to exemplary communication, storage and processing devices. It is to be appreciated, however, that the disclosure is not restricted to use with the particular illustrative configurations shown. Aspects of the disclosure provide methods and apparatus for simulation-based online optimization of workflows.

In one or more embodiments, improved techniques are provided for workflow optimization. A state of one or more workflow executions of concurrent workflows in a shared infrastructure environment is collected. The state comprises provenance features of the concurrent workflows. One or more control variables are identified from the plurality of provenance features. A simulator accounts for the possible transitions between states due to changes in the control variables. An exemplary simulated state space provides a flexible model that allows the impact of the state transitions on the total execution costs to be evaluated.

Among other benefits, the disclosed state space allows sample paths to be generated that otherwise would not have been observed in controlled experiments, by changing the control variable. The promising sample paths can optionally be further evaluated. In some embodiments, search algorithms can be executed on the sampled state space to find a substantially optimal path from any given state towards one of the final states, by attributing a utility function as transition costs that assigns a utility score to the states in the simulation model. A configuration of the control variable(s) can be determined that substantially maximizes the utility function for states in the simulation model.

During a real-time execution of new concurrent workflows, instantaneous provenance features of the new concurrent workflows are collected and a current state of the real-time execution is obtained with the instantaneous provenance features. A substantially most similar state can be identified with one of the determined configurations of the control variable(s) in the simulation model with a substantially highest similarity to the current state given by state similarity functions. The configuration of the control variable(s) of the real-time execution is then adjusted to substantially match the corresponding configuration of the control variable(s) of the substantially most similar state.

Workflows are typical client applications in Infrastructure as a Service (IaaS) environments. One challenge in this area comprises establishing an efficient strategy to allocate resources, such as CPUs (central processing units) and memory, to different concurring batches of workflows so as to maximize users' experience and minimize costs. In one or more embodiments of the present disclosure, a method is disclosed for workflow resource management optimization, particularly (but not restricted) to large Infrastructure as a service (IaaS) environments. It is noted that as used herein an "optimization" does not require that the configuration of a workflow is optimum in an absolute sense, but rather that the configuration of a workflow is substantially optimum based on one or more predefined metrics, discussed below.

One or more aspects of the disclosure leverage captured provenance data in order to build a simulation that allows for online substantial optimization of workflow executions. The exemplary method, in one or more embodiments, may be summarized as follows:

1. Collect provenance data from real world executions of workflows in distributed environments. Measurements are collected for different executions of the workflows, under different environment configuration and for different inputs;

2. Compose a state, such as snapshots, from the provenance data, that capture the state of each workflow's execution at regular time intervals, optionally creating artificial snapshots to fill in gaps in the represented data;

3. Determine one or more control variables from the features represented in the snapshots, over which the workflow execution orchestrator has control;

4. Build a state space (e.g., a workflow execution simulation structure), by mapping a state (defined, for example, by a set of snapshots) to another state, for each possible change in one or more control variables in the aforementioned state;

5. Explore the state space in a principled manner, extrapolating the execution paths observed in the measurements by allowing dynamic changes of control variables that impact the resource allocation;

6. Define one or more utility functions that represent aspects of interest for both the provider and client of the execution environment, numerically representing preferences and tradeoffs in cost, execution time and other quality of service metrics;

7. Search for the optimal path that substantially maximizes each of the utility functions at each possible state, and persisting the result in an indexed data structure. By exploring the alternative simulated executions and determining optimal paths, resource allocation strategies can be identified that would otherwise be difficult to find exclusively through controlled real-world workflow emulation;

8. Define a state-similarity function that allows for the comparison between a newly observed state, in a real-time execution of new batches of workflows, and all states in the previously built state spaces;

9. Optimize a real-time execution of new batch of workflows regarding a utility metric by:

a. Determining the current state of the workflows being executed;

b. Finding the closest (substantially most-similar) state(s) among the ones already observed corresponding to the current system state;

c. Changing the one or more control variables in the current system to match the values of the one or more control variables path in the optimal path(s) computed for the substantially most-similar previously explored state(s).

Workflow Background

Workflows are pervasive for the processing of large datasets, with applications that range from seismic analysis to health monitoring. Such workflows are usually deployed in heterogeneous computer infrastructures, comprising machines with a broad range of configurations, which may be part of a public cloud or a private cluster dedicated to the execution of multiple workflow instances. A key challenge faced in heterogeneous contexts, such as in IaaS environments, comprises establishing efficient resource allocation strategies to share the infrastructure among the multiple workflows and stakeholders. The goal is to substantially maximize or substantially minimize a given target metric, such as substantially minimizing the cost associated to a given execution.

To this end, control variables are dynamically adjusted, as a function of an estimate of the current system state and of the impact of the actions on costs. Examples of control variables include the number of active cores (e.g., CPUs) dedicated to a given batch of workflows, and the amount of memory reserved for a given application. Furthermore, control decisions must be made in real time.

One of the cornerstones for automatic resource allocation strategies based on earlier executions is the collection of telemetry and provenance data. The data typically comprises a set of measurements collected from the workflow, when executed in a controlled environment.

Provenance data, however, does not cover all cases, and does not provide complete information on the results of actions in each state. The number of paths that exhaustively cover all scenarios associated with a given workflow often grow exponentially with respect to the number of control variables. Therefore, it is often not feasible to explore, in a controlled environment, all of the available use-cases, accounting for multiple (a) workflow inputs, (b) asynchronous events generated by the workflow, and (c) background tasks that may directly or indirectly impact the workflow execution.

The simplest controlled experiments executed in a testbed account for constant and known control variables. Further executions of the workflow under the proposed control mechanisms may provide additional information on the impact of the control variables on the system states. Nonetheless, due to the intrinsic asynchronous and heterogeneous nature of the systems being considered, the execution of new instances will very likely lead to states that have not been observed beforehand. The impact of control variables on such unexplored system states needs to be inferred based on the available data.

The richer and more accurate that the available measurements are, the better is the outcome of the optimization solutions. Nonetheless, collecting data is an expensive and error-prone process, involving noise and artifacts intrinsic to the heterogeneous systems under consideration. Therefore, the proposed solutions need to trade between expanding on data collection campaigns and refining models that extract as much information as possible from the available data.

To perform a "what-if" analysis, and better estimate the impact of actions on system states, one may aim at setting the system state to a given pre-established reference value. Nonetheless, keeping track of system states through observations is much simpler than setting the system state to a certain value. For this reason, revisiting a given state in a real testbed is challenging, even if the whole workflow is re-executed, which in general can be very time consuming.

A resource allocation policy is associated with short and long-term costs. Short-term costs include the immediate cost of changing the resource allocation, which may involve restarting certain tasks (preemption cost). Long-term costs must account for the fact that certain segments of the workflow are I/O (input/output operation) bound whereas others are CPU bound. Given the current system state, one goal is to determine if a change in the resource allocation will have a global positive impact in terms of decreasing costs and increasing quality of service in the time horizon under consideration based on the current system state.

Simulation-Based Workflow Optimization

One or more embodiments of the disclosure leverage captured provenance data, in order to build a simulation that allows for online optimization of workflow executions.

Provenance Capture and Snapshots

U.S. patent application Ser. No. 15/364,449 (now U.S. Pat. No. 10,909,503), filed Nov. 30, 2016, entitled "Snapshots to Train Prediction Models and Optimize Workflow Execution," incorporated by reference herein in its entirety, defines a method to manage the execution of workflows while orchestrating the collection of snapshots as timestamped contextual provenance and telemetry information datasets.

FIG. 1 illustrates the relationships between elements in a provenance graph 100 for a workflow, according to one embodiment of the invention. The vertices of the provenance graph 100 are entities 110 or activities 120. Entities are input, intermediate and output data in the workflow. Entities 110 can also be associated with abstract concepts, such as the workflow itself, telemetry registries, status of activities and computer resources, such as processors and allocated memory. Activities 120 are computer programs or human-made processes that create or transform data. Activities 120 and entities 110 are related through a consumer-producer interface. Using the PROV terminology, activities use entities (used relationship 112) and entities are generated by activities (wasGeneratedBy relationship 114). Entities 110 can be derived (wasDerivedFrom relationship 116) from other entities 110, for instance, the telemetry data 130 can be derived from a workflow execution. In one possible embodiment of the disclosure, an entity 110 is created to represent the workflow execution as a whole and a related entity 110 to represent its telemetry data 130. Besides the telemetry data 130, the entities 110 of the graph are derived from the workflow execution entity.

Activities 120 of a workflow are executed using a specific set of entities 110, which includes the input dataset and execution parameters. Besides, activities 120 get to specific statuses 150 at specific time instants (atTime relationship 118). For instance, an activity gets a 'running' status at a given timestamp to indicate that it has started its execution at that time. In one or more embodiments, the (i) input data, the (ii) parameters, the (iii) status, (iv) output data, (v) workflow execution, and (vi) telemetry data are represented as entities. However, these listed elements are stored using different semantics, as shown in FIG. 1.

Throughout the discussion, a similar definition of a snapshot is assumed as containing provenance data about the workflow execution including the description of the status of the activities (already executed, being executed or still to be executed), the assignment of resources to the activities, features of input and intermediate data sets and metrics about the execution of each activity.

Figure 2:
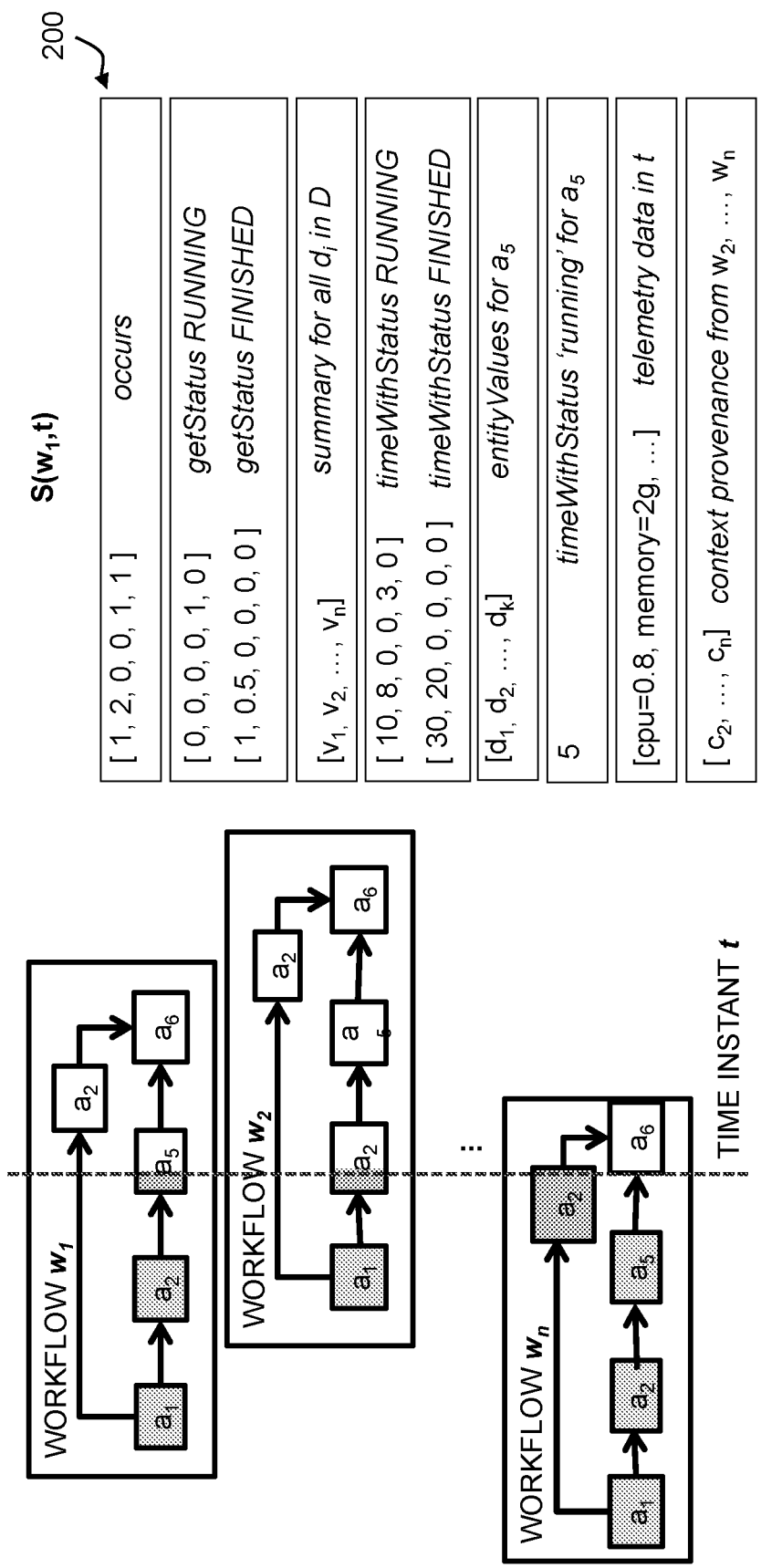
FIG. 2 shows an example of a snapshot for a workflow $w_1$ of a plurality of concurrent workflows $w_1$ through $w_n$, at a time instant t, according to one embodiment of the disclosure.

FIG. 2 shows an example of a snapshot 200 for a workflow $w_1$ of a plurality of concurrent workflows $w_1$ through $w_n$, at a time instant t, according to one embodiment of the disclosure. Consider that A is the set of all known types of activities 120, D is the set of all known entities 110 and E is the set of all known status types 150 (e.g., pending, running and done). A workflow definition contains a list of activities, each of type $a_i \in A$.

Reading the snapshot 200 for workflow $w_1$, it is possible to check that activities 120 of type $a_2$ occur twice in the workflow $w_1$. It is also possible to check that an activity of type $a_5$ is running, an activity of type $a_1$ has finished and 50% of the activities of type $a_2$ in the workflow $w_1$ have finished. It is also possible to check the average execution time for every activity in the workflow. For the currently running activity of type $a_5$, it is possible to check the used values for the entities in D as well as the time spent on each state.

In addition, the snapshot 200 for workflow $w_1$ further comprises contextual provenance, $c_2, \ldots, c_n$, from the other concurrent workflows $w_2, \ldots, w_n$. For the examples discussed herein, a configuration of snapshots is assumed, similar to the one shown in FIG. 2. In this configuration, not only does snapshot S(w, t) of workflow w at instant t includes telemetry data and provenance data of w at that instant, but also the contextual information of the other workflows running concurrently with w.

Notice that in the example of FIG. 2, the telemetry data captured at instant t are presented as features in each of the snapshots captured at that instant, for all workflows running concurrently. This synchronous collection of provenance data substantially guarantees that the snapshots are coherent (e.g., in a batch of workflows, a set of snapshots is said to be coherent if, during the period under consideration, one snapshot is available for each workflow at regular time intervals).

This synchronous collection of provenance data does not configure a restriction of the method, as it is possible to extrapolate the data of asynchronously captured snapshots in order to 'fill' the unrepresented time instants of a workflow that are represented in others. Additionally, even with snapshots taken at regular time intervals, a number of factors may impact snapshot coherence, including:

Startup delays: some workflows take longer to initialize than others, or may be scheduled to start when others are already running. In this case, the already running workflows would have snapshots at time instants not represented in the new one.

Pauses: the execution orchestrator may halt or pause a single workflow, generating a gap of snapshots for one or more workflows.

Asynchronous events and delays: asynchronous events and background load may cause measurement delays.

Figure 3:
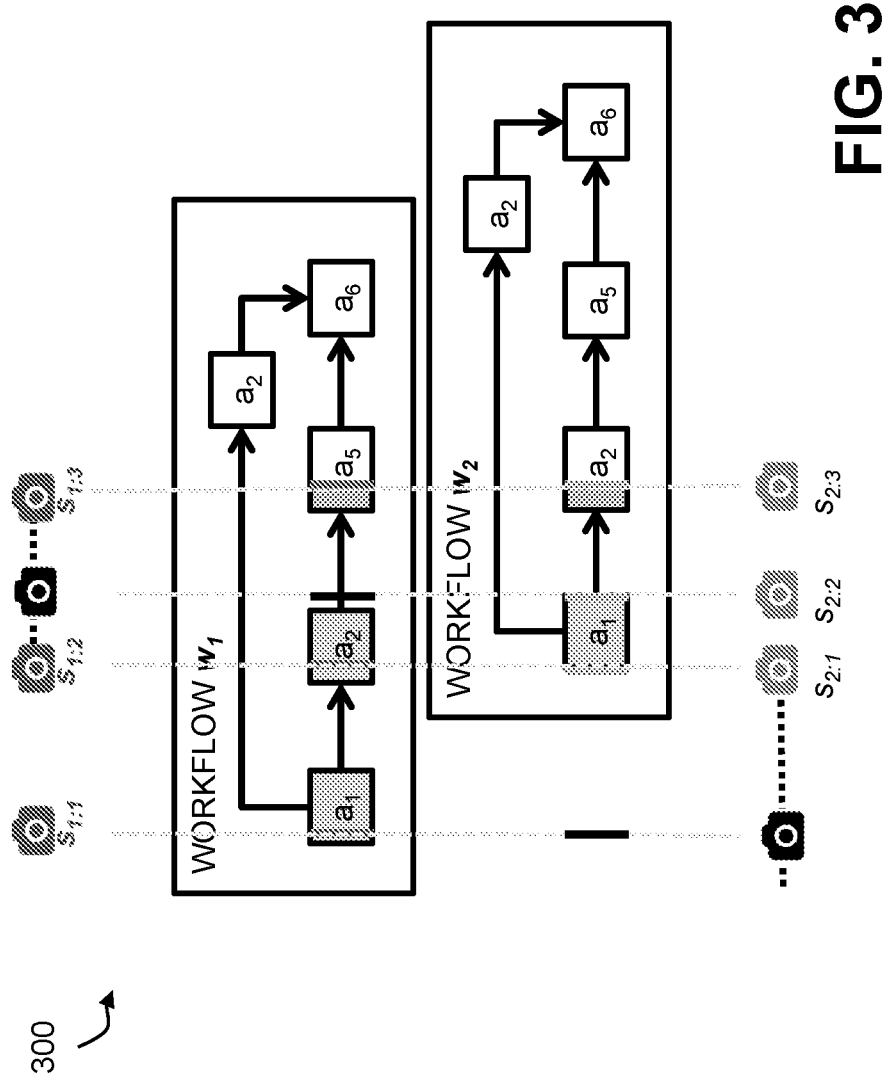
FIG. 3 illustrates a representation of exemplary snapshots collected from the execution of exemplary concurrent workflows, according to an embodiment.

FIG. 3 illustrates a representation 300 of exemplary snapshots $s_{1:1}$ through $s_{1:3}$ and $s_{2:1}$ through $s_{2:3}$, collected from the execution of two exemplary concurrent workflows $w_1$ and $w_2$, where snapshots $s_{a:z}$ are the z snapshots captured from workflow $w_a$. In FIG. 3, snapshot $s_{1:1}$ is taken from workflow $w_1$ before workflow $w_2$ starts, and therefore there is no concurrent snapshot from $w_2$ at that time instant. Conversely, there is no snapshot for $w_1$ taken at the same time as $s_{2:2}$ for $w_2$, exemplifying an asynchronous delay in measurement.

Many techniques are appropriate for addressing the lack of coherence in snapshots. A backward fill (e.g., assigning to a time instant the next valid snapshot for that workflow) can be applied to account for startup delays. In the example of FIG. 3, a virtual snapshot for $w_2$, which consists of a copy of $s_{2:1}$, can be created in one or more embodiments, via a backward fill to match snapshot $s_{1:1}$. A forward fill replicates the previous valid snapshot. Alternatively, an interpolation between the previous and the next available snapshots can be used as an interpolation fill, as would be apparent to a person of ordinary skill in the art. Both the forward and interpolation fill approaches may be used to generate a snapshot for $w_1$ that matches snapshot $s_{2:2}$. In the case where interpolation is used, this snapshot is generated by mixing $s_{1:2}$ and $s_{1:3}$.

Figure 4:
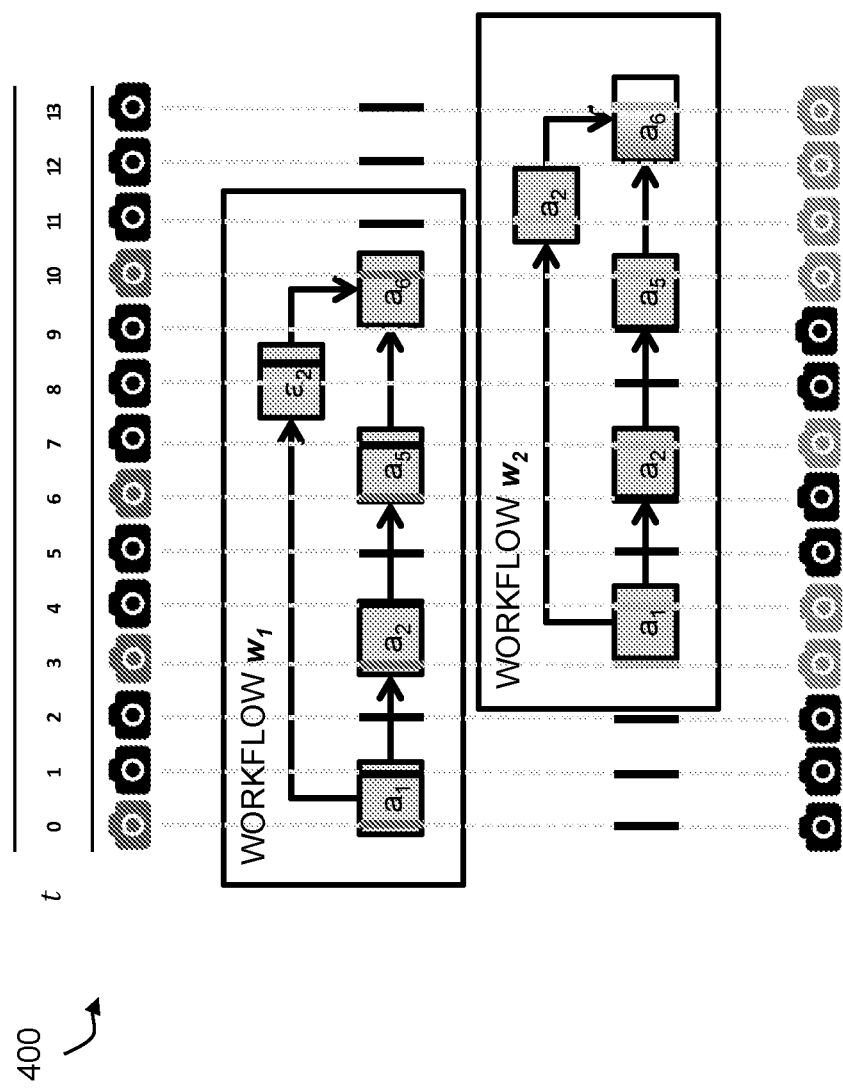
FIG. 4 illustrates a re-indexing of the snapshots of FIG. 3 for the two exemplary workflows, according to an embodiment of the disclosure.

Notice that, through similar techniques as those described above for the extrapolation of the snapshots, it is also possible to increase the granularity of snapshots, if necessary. FIG. 4 illustrates a re-indexing 400 of the snapshots of FIG. 3 for the two exemplary workflows $w_1$ and $w_2$, according to an embodiment of the disclosure. It is noted that the snapshots have been re-indexed by the relative time instant t that the snapshot represents. Alternative embodiments where the absolute execution timestamps are kept are also possible, as would be apparent to a person of ordinary skill in the art. In the example of FIG. 4, coherence is substantially guaranteed by filling and interpolation, with increased granularity The substantial guarantee of coherence simplifies the simulation aspect of the present disclosure, in one or more embodiments. With one snapshot for each workflow at each instant, a state is defined as the set of snapshots taken at the same instant. The concept of state is also tied to the concept of control variables: a state is an observable configuration of the system in that it is possible to enact a change in control variables. In FIG. 4, each of the fourteen time instants 0-13 defines a state, where each state comprises two snapshots (one for each workflow).

A coherent set of snapshots naturally yields a state space with cardinality proportional to the size of the workflow batch (e.g., the workflows' duration). As described further below, the implementation of state transitions is also simplified once coherence is substantially guaranteed.

Control Variables

Among the features collected in each snapshot, consider a set of one or more control variables. These control variables represent features that can be controlled by the workflow execution orchestrator. Typically, in applications for decision making and optimization in IaaS environments, these variables are related to the usage and allocation of computational resources to certain tasks or workloads.

In one or more example embodiments, a single control variable is assumed—the number of allocated execution cores for the execution of a batch of four workflows hereinafter referred to as the number of cores. The disclosed techniques for simulation-based online optimization of workflows presented herein, however, apply to cases in which several control variables are defined, as would be apparent to a person of ordinary skill in the art. One generalization of the concept would be to consider these variables as a tuple whose domain is the Cartesian product of the domains of the component variables.

The control variables determine the possible 'actions' of the workflow execution orchestrator. In the running example, this corresponds to increasing or decreasing the number of cores allocated for the execution of a batch of workflows. The possible values for the control variables limit and determine the transitions in a state-space, as will be described below. In the use case described herein, the control variable is discrete, but continuous variables can be used by applying discretization techniques, such as binning of relevant ranges, as would be apparent to a person of ordinary skill in the art.

Control variables can be defined after the provenance data is collected, as long as the control variable is among the collected features.

Utility Metrics

Service Level Agreements (SLAs) in IaaS environments usually define metrics of quality of service (QoS). Examples of usual metrics include uptime of service, accuracy of results, substantially minimal resource allocation, substantially maximum execution time, and total execution cost. The optimization problem in workflow executions in IaaS environments is defined with respect to one or more QoS metrics, accounting for the control variables, as described above.

The workflow optimization problem in IaaS is defined as a substantial maximization (or minimization) of utility (negative utility) metrics over the execution of one or more workflows sharing and competing for computational resources. From the perspective of the service provider, an important aspect for optimization is to substantially minimize resource allocation while still ensuring that SLA conditions are met. In the running example, a negative utility metric of total execution cost is used, which directly relates to resource consumption (number of cores) and total execution time, and aim at substantially minimizing the total running cost for a batch of concurrent workflows.

Example Use Case

Recall a basic description of a use case that is referred to throughout this document in order to illustrate the present disclosure. This case configures a typical embodiment of the disclosure, with many possible generalizations. Some of these generalizations are described in the related sections, above, and others are described along the text.

The running example comprises the executions of batches of four concurrent workflows each, where each workflow is an instantiation of a known workflow configuration (the set of activities and the partial order between them that constitutes the configuration of a workflow). At each time instant, one snapshot of each of these four workflows is collected. As discussed above in conjunction with FIG. 2, at time instant t, one snapshot is collected for each of the workflows $w_1$, $w_2, \ldots, w_n$ where n=4.

Each snapshot includes the values of the arguments passed to each activity already started in the workflow, as well as the execution times for each activity. As described above in conjunction with FIG. 2, each snapshot also has features related to the aggregate context provenance of the other three workflows running concurrently to it, such as which activities are currently executing in the other workflows. Among the features collected in each snapshot for the running example is the number of cores, the value assigned to the control variable during the executions of the four workflows within the respective batch. The possible configurations for the single control variable are two cores, four cores or 12 cores.

Recall the discussion on coherence of snapshots and definition of a state, discussed above. Assume in the running example that snapshots for each workflow in a batch are collected synchronously (e.g., one snapshot for each workflow every three seconds). In the present example, a state is a set of four snapshots (the configuration of the four workflows running in a same batch) where the infrastructure orchestrator can change the number of cores allocated for the execution of that batch. In this particular case, since changes in the number of cores can be made every second, and to cope with the lack of coherence due to the issues pointed out above, the granularity of the snapshots was increased from once every three seconds to once every second.

In one or more embodiments, the total cost function that configures one exemplary utility metric function is as follows:

$$\overline{C} = \sum_{t=1}^{T} C(n_t) + D_t$$

where: $C(n_t)$ gives the number of cores allocated at instant t; $D_t$ is the cost of changing configuration of number of cores (0 if no change at instant t); T is the total running time; and $\overline{C}$ configures the total cost for a period of T seconds.

Snapshot Based Simulation

In this section, a state space data structure is built from coherent snapshots of workflow batch executions that can configure a simulation system capable of generating traces that were not represented in the provenance data used to build those snapshots. Furthermore, this state space allows counterfactual reasoning about what the best decisions over a control variable would be in each of the observed states, even if those decisions were not observed themselves.

Figure 5:
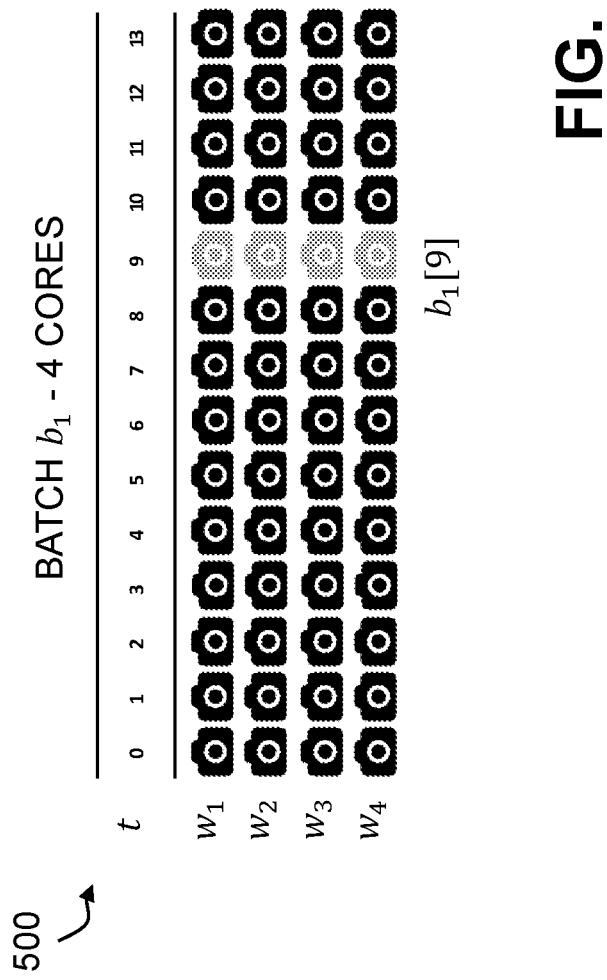
FIG. 5 provides a representation of the timestamped snapshots of a batch $b_1$ of executions of workflows $w_1$, $w_2$, $w_3$ and $w_4$ with four processing cores, according to an embodiment of the disclosure.

Recall from previous definitions that a set of concurrent snapshots represents multiple workflows running in parallel. A set of workflows running together in a coordinated fashion is referred to as a batch. FIG. 5 provides a representation 500 of the timestamped snapshots of a batch $b_1$ of executions of workflows $w_1$, $w_2$, $w_3$ and $w_4$ with four processing cores, according to an embodiment of the disclosure.

FIG. 5 illustrates a static configuration (e.g., one in which the control variable(s) are kept fixed for the complete execution). Although the following examples reference batches of static configurations for ease of explanation, one or more embodiments of the disclosure also cover the cases in which configurations are dynamic (e.g., with batches in which the control variable is changed mid-execution).

It is noted that real executions of workflow batches may be very long, and that the running example shows a very small batch (executed for 13 time units—here, seconds) for ease of explanation.

In one or more embodiments, t is implemented as an array of absolute execution times for the present use case, but this is not necessary for the general method presented herein (the values of each batch's t array could be re-indexed to start at zero with no effects on the following exposition). In fact, the representation of time is only necessary for clarity of exposition—define $b_i[j]$ to be the state (e.g., the set of snapshots) given by batch $b_i$ at instant j. FIG. 5 highlights exemplary state $b_1[9]$, for example.

The present disclosure assumes a coordinated provenance collection regarding the control variable: where workflows with similar configurations have been executed with variation solely in control variables (ceteris paribus). This defines the concept of sibling batches—batches that represent the execution of the same workflows, differing only in the value of the control variable(s).

Figure 6:
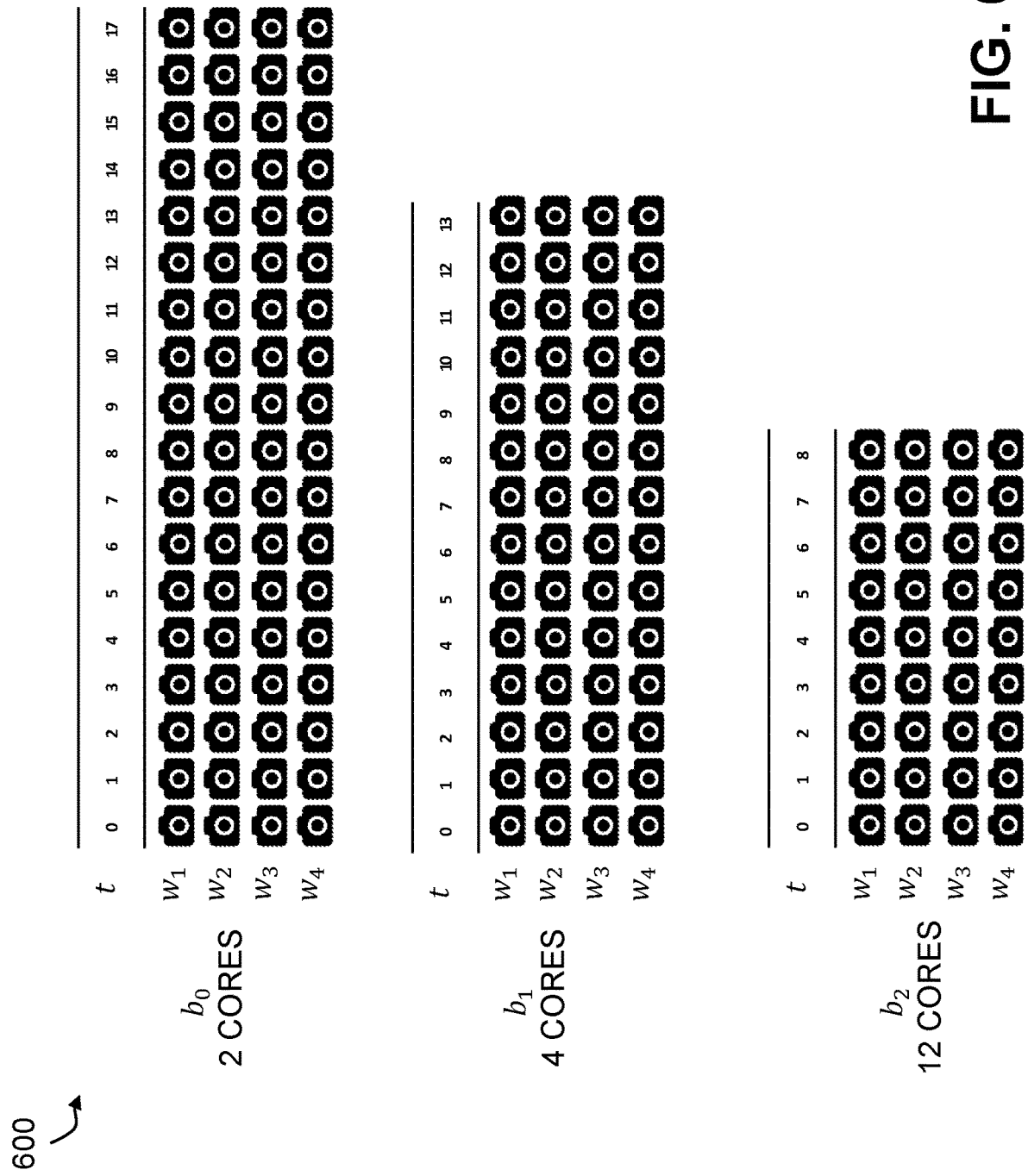
FIG. 6 illustrates an endogenous state space defined by sibling batches of workflows, including batch $b_1$ of FIG. 5, with executions of the same workflows with differing values for a number of cores (an exemplary control variable), according to one embodiment.

FIG. 6 illustrates an endogenous state space 600 defined by sibling batches $b_0$, $b_1$ and $b_2$ of workflows, with executions of the same workflow configurations $w_1$, $w_2$, $w_3$ and $w_4$ with differing values for the number of cores (the exemplary control variable), according to one embodiment. In the example of FIG. 6, the batches $b_0$ through $b_2$ are collected for the control variable set to 2, 4 and 12 cores, respectively.

In the example of FIG. 6, although each batch is internally coherent, batch $b_2$ is 'shorter' (e.g., composed of less snapshots) than batch $b_1$, presumably due to the execution of those workflows with 12 cores taking less time to complete than processing would take with 4 cores. These sibling batches configure the endogenous state space for that experiment.

An endogenous state mapping function, f, is defined as follows: $f: X \xrightarrow{a} Y$. This function relates states in the endogenous state space, mapping state X to state Y under configuration a, where the configuration corresponds to an attribution of values for the control variable(s). Thus, the endogenous state mapping establishes that in state X applying configuration a causes the system to transition from X to a state that is well approximated by state Y. State Y is the nearest neighbor of X, in the endogenous state space, under the given set of control variable(s) value(s) a.

Figure 7:
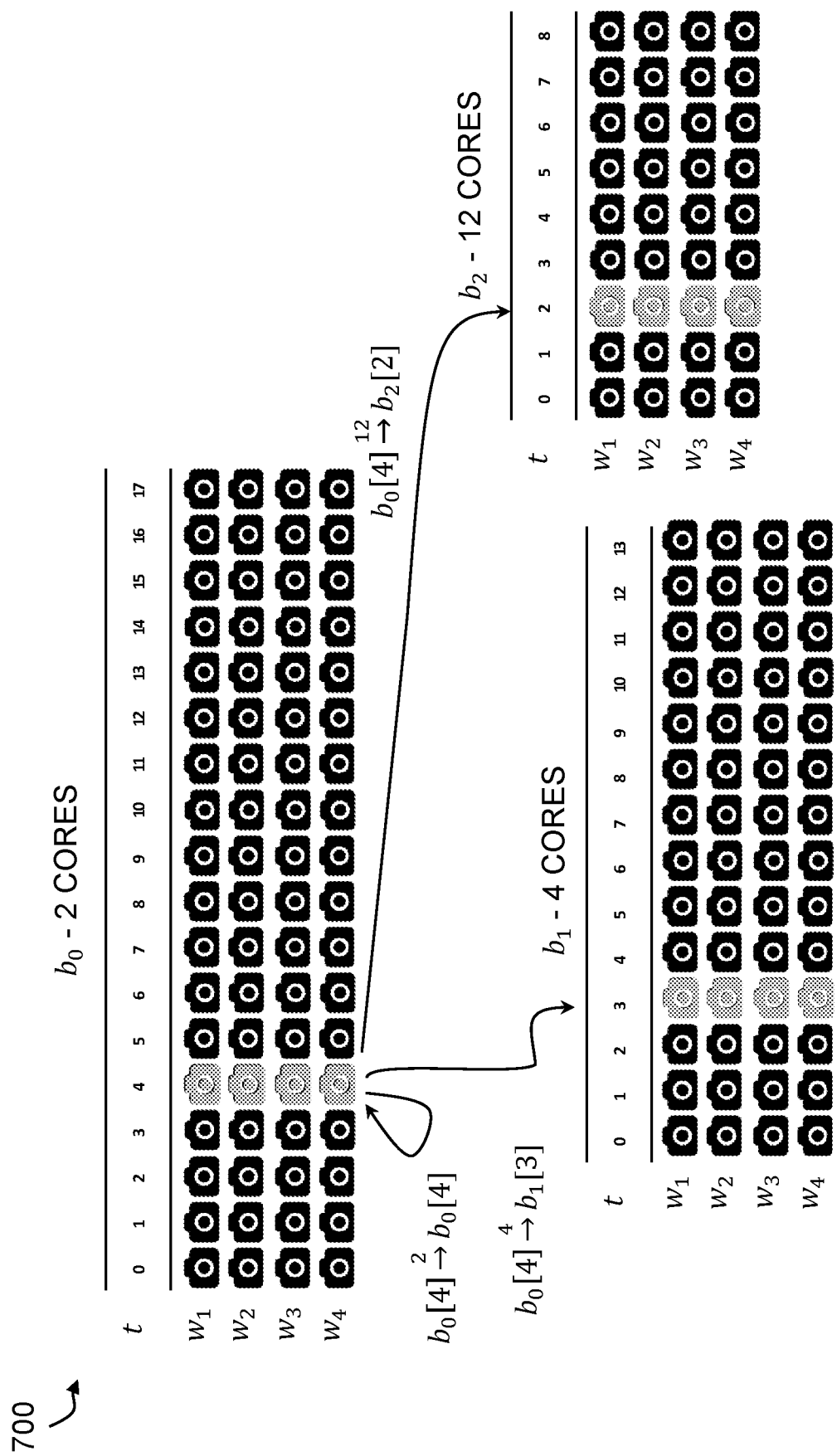
FIG. 7 illustrates an example of the endogenous state mapping function for mapping a particular state under differing numbers of cores as the control variable, in the endogenous state space of FIG. 6, according to an exemplary embodiment.

FIG. 7 illustrates an example of the endogenous state mapping function, f, for mapping 700 of state $b_0[4]$ (e.g., snapshot 4 of state $b_0$) under actions 2, 4 and 12 (e.g., exemplary changes in number of cores, the control variable) in the endogenous state space, according to an exemplary implementation of the endogenous mapping function.

Notice that this mapping does not represent an advance in execution time—it merely 'translates' the current state to the substantially most similar one with a different value for the control variables. In the running example, state $b_0[4]$ under a configuration with 2 cores translates into $b_0[4]$ itself, while under configuration 12 cores it translates into $b_2[2]$.

Many alternative implementations of endogenous mapping functions can be defined, as would be apparent to a person of ordinary skill in the art. Consider two such possible alternate implementations in the domain of the running example:

1. Mapping Based on Batch Length: this is an example of an endogenous mapping function where no details of the snapshots composing the state are used. This function comprises mapping states by the relative time instant they represent in their respective batches. This is the mapping applied in the example of FIG. 7, where batch $b_0$ is twice the length of batch $b_2$, and therefore $b_0$ [4], being the 5$^{th}$ state in batch $b_0$, maps to the 3$^{rd}$ state of batch $b_2$. This method has the advantage of being relatively easy to compute, and may achieve reasonable results if batches do not contain pauses in workflow executions nor great variations in the order of execution of tasks within workflows (assuming preemption with continuity).

2. Mapping Based on Workflow Stages: this is an example of an endogenous mapping function where details of the snapshots composing the state are used. This relates to and is enabled by the collection of contextual provenance data in the snapshots, as discussed above in conjunction with FIG. 2. This function comprises observing, in the contextual provenance information of the snapshots composing the state, which tasks have already finished. Then, the state is mapped into the earliest state in the target batch in which the same set of tasks has already finished. This method has the advantage of more accurately representing resource consumption aspects of the tasks within workflows, especially when the profile of resource consumption varies a lot between tasks. The 'loss' of work represented by returning to the start of the running tasks in the target state can represent that changing the control variable(s) requires restarting those executions (assuming preemption with restart).

In one or more embodiments, the endogenous state space and the endogenous mapping function configure a complete Markovian model—at each simulation step, the state is fully determined by the set of current snapshots, and encapsulates all possible next states in a simulation where the actions are all the possible changes in the control variable(s). Therefore, given the current state, the future of the simulation is assumed to be independent of previous snapshots.

An action in the simulation corresponds to translating the current state to the one given by the endogenous mapping function and the desired control variable configuration, and then incrementing the time index in that state by r seconds, where r is resolution of the simulation (the time interval between changes in configuration of the control variables). In the examples below, a resolution r=1 is used, for ease of explanation.

Two special states belonging to the endogenous space state are also defined: a special sink state $b_{end}$, which represents the simulation end; and a source state $b_{ini}$, which represents the initial state of an un-started batch execution.

Let $b_0, b_1, \ldots, b_n$ be the batches in an endogenous state space, each corresponding to a control variable configuration $c_x$, $0 \leq x \leq n$.

The endogenous mapping function is amended to consider the endogenous state so that $b_{ini} \xrightarrow{c_x} b_x[0]$. That is, the initial state translates into the first state of each batch, given the corresponding control variable configuration.

Figure 8:
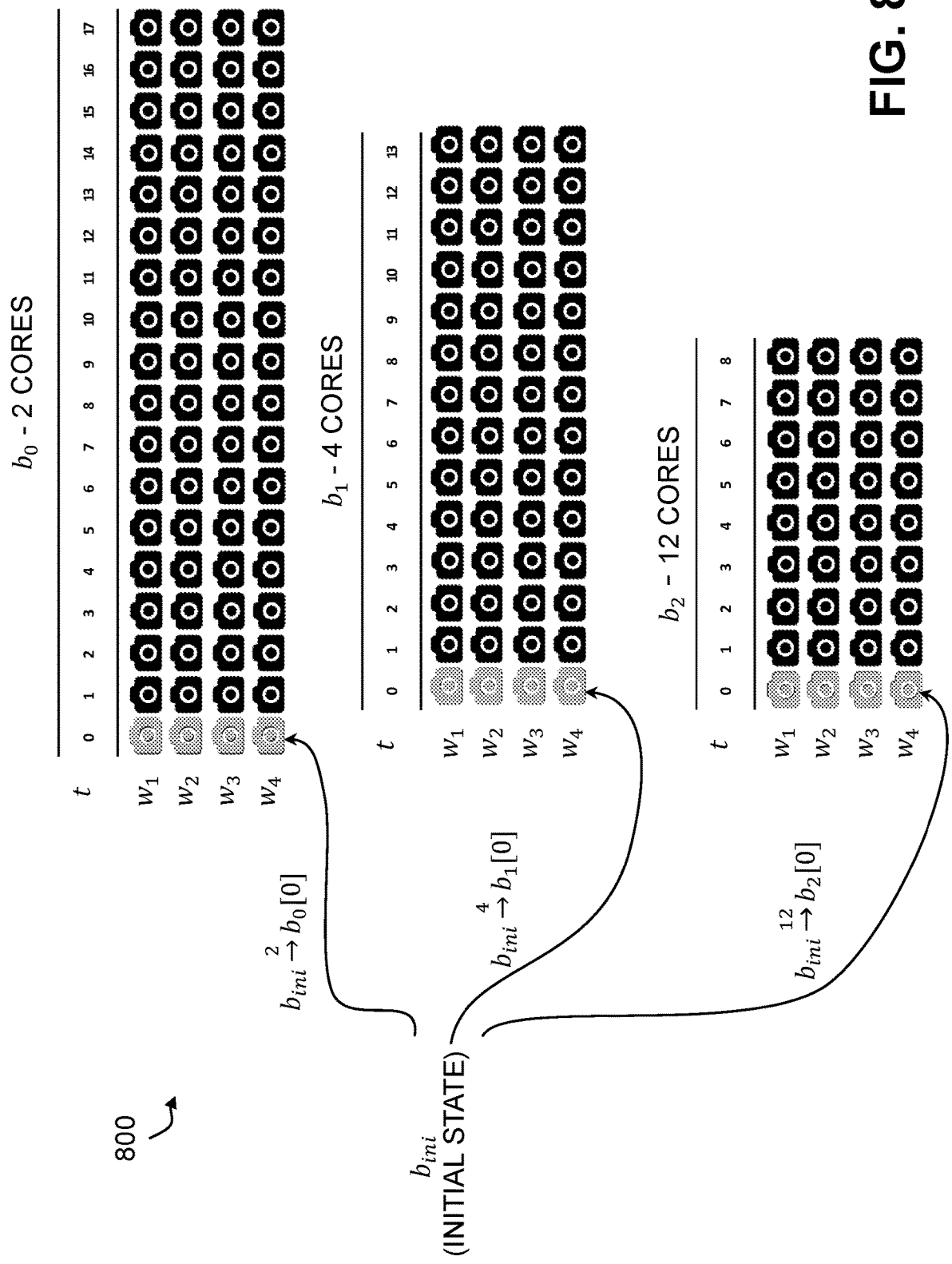
FIG. 8 provides a visual representation of an extended endogenous mapping function to translate an initial state into the first state of a batch given the corresponding configuration of control variables, according to one embodiment of the disclosure.

FIG. 8 provides a visual representation of the extended endogenous mapping function 800 to translate the initial state $b_{ini}$ into the first state of a batch given the corresponding configuration of control variable(s), according to one embodiment of the disclosure. Let max($b_x$) be the substantially maximum value for the relative time index t in batch $b_x$. In the running example, max ($b_0$) is 17; while max($b_2$) is 8.

Let:
$0 \leq x, y \leq n$;
$0 \leq i \leq \max(b_x)$; and
$0 \leq j \leq \max(b_y)$.

Then, $b_x[i] \xrightarrow{c_y} b_y[j]$ represents that changing to configuration $c_y$ at state $b_x[i]$ yields state $b_y[j]$.

In this context, the action of applying configuration $c_y$ at state $b_x[i]$ is defined, as follows:

$$A(b_x[i], c_y) = \begin{cases} b_y[j+r], & j+r \leq \max(b_y) \\ b_{end}, & \text{otherwise} \end{cases}.$$

In other words, an action in the simulation corresponds to translating the current state to the one given by the endogenous mapping function and the desired control variable configuration, and then incrementing the time index in that state by the resolution. If that extrapolates the substantially maximum timestamp in the resulting batch, the trace is complete and the simulation reaches the final state $b_{end}$.

Notice that the resolution parameter determines the time step between states in a simulation trace. The substantially minimum possible value for r is the time granularity between snapshots. Keeping the current configuration with the substantially minimum values for r leads directly to the next in the same batch.

Recall the example from FIG. 7. With a resolution of r=1, the action of changing to the configuration of 12 cores at state $b_0$[4] leads to state $b_2$ [3]. The action of keeping configuration of four cores in state $b_1$ [13] leads to $b_{end}$.

The simulation model defined by the endogenous state space and the possible actions can be represented by a directed graph where each node is a state, and where labeled outgoing vertices represent the actions.

Figure 9:
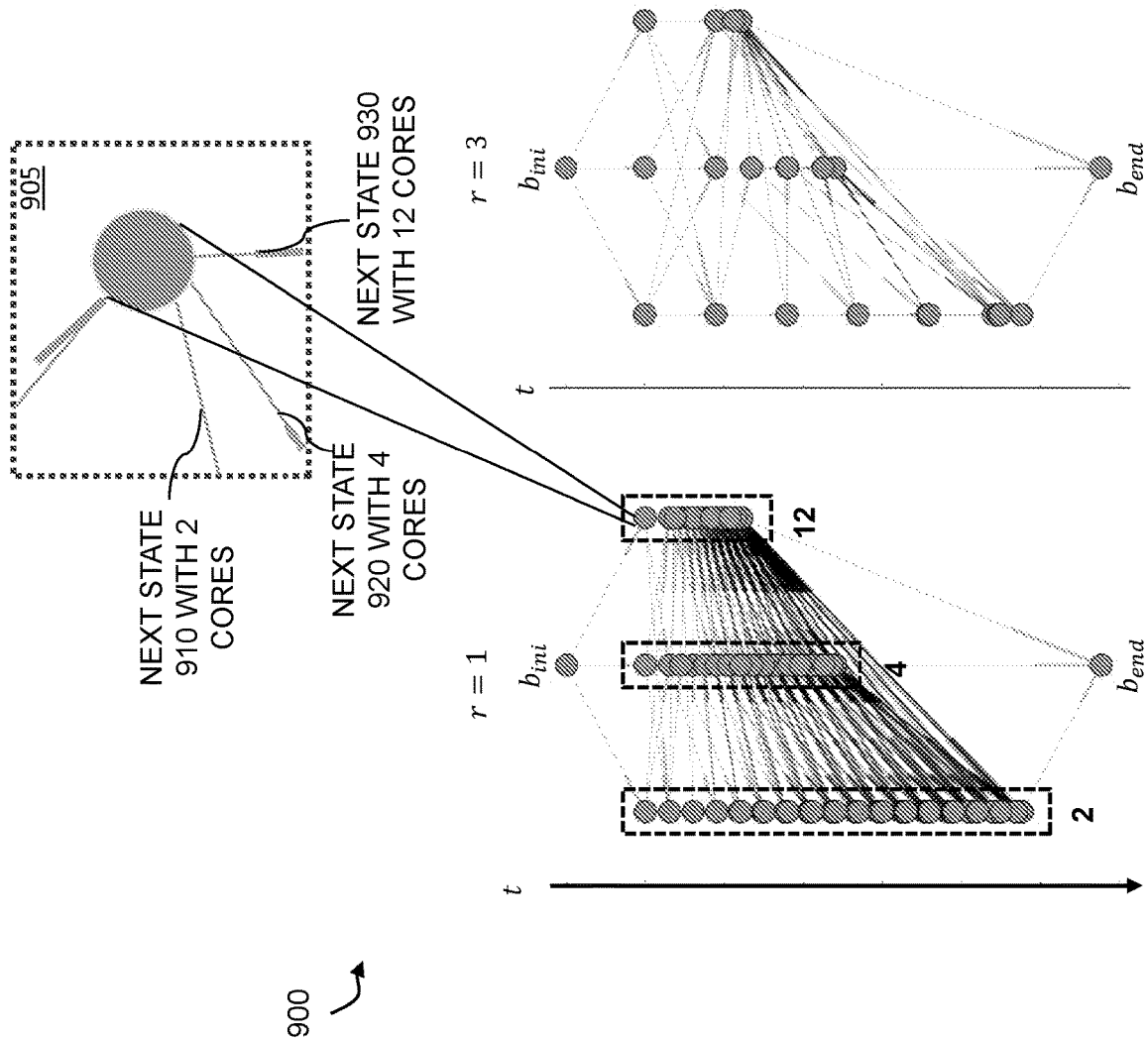
FIG. 9 illustrates a graphical representation of an endogenous state space for a running example, where the states are horizontally aligned by the configuration (e.g., number of cores) and vertically aligned by the relative timestamp, according to one embodiment.

FIG. 9 illustrates a graphical representation of an endogenous state space 900 for the running example, where the states are horizontally aligned by the configuration (number of cores) and vertically aligned by the relative timestamp, according to an embodiment. Generally, the exemplary endogenous state space 900 highlights the alignment of states by the configuration they represent.

Recall that the running example shows a very short execution for these workflows, and that a typical execution of a batch of workflows is much longer. This means that the graph built from snapshot states in a typical execution would be much larger than shown in FIG. 9, with possibly thousands of states.

Recall also that in the running example, the granularity of snapshots being one second (r=1, in FIG. 9) means that the number of cores can be changed every second, and each change 'lasts' for one second before another change can be applied. Suppose, however, that it were only possible to change the number of cores every 3 seconds. In that case, representing excessive intermediate states becomes unnecessary. The resolution parameter allows the simulation model to be more compact, which can greatly influence the running time of the substantially optimal path search, described below.

FIG. 9 also shows the granularity of snapshots being three second (r=3). Avoiding this unnecessary computational overhead is of great importance in typical cases where the graphs are very large.

Thus, FIG. 9 allows a comparison of the example state space for the running example graph with two different values of resolution r, illustrating the concept that higher resolutions (r=3) can significantly reduce the state space 900.

FIG. 9 also illustrates an expansion of one particular state 905, where the next state 910, 920 or 930, from the particular state 905, is selected based on the number of cores (2, 4 or 12 cores, respectively).

The set of all possible complete walks in this state space 900 configures the possible traces in this simulation (with that resolution). Formally, a trace is a $(b_{ini}, b_{end})$-trail (e.g., a walk with no repeated nodes) in the state space graph. Notice that among the possible traces generated by the simulation, some account for changes in control variables that have not been executed in a real testbed. This configures one of the main advantages of the simulation approach—the generation of novel examples, exploring actions that were not taken in the real world.

Snapshot Based Optimization

In one or more embodiments, a snapshot simulation model can be coupled with an online optimization strategy for workflow executions in IaaS environments, as discussed hereinafter. The approach leverages preprocessed optimal paths in simulation graphs and state similarity measures.

In U.S. patent application Ser. No. 15/364,449 (now U.S. Pat. No. 10,909,503), referenced above, snapshots are used to train predictive models, which are in turn used to substantially optimize future workflow executions by assigning resources to activities based on the best predicted outcome. In the present disclosure, a method is provided for the optimization of future workflow executions with similar goals, but relying instead on a simulation model built from the previously described snapshots. The simulation model leverages and extends predictive models trained to estimate completion times from each of the available snapshots.

In the present approach, new provenance data can be incorporated into the "optimizer" simply by amending the state space that configures the simulation. This amounts to rebuilding the state space graph including newly generated states.

Preprocessing of Optimal Paths in State Space Graphs

Consider a strategy for preprocessing of optimal paths in a state space graph 900. Given a batch of workflows to be executed, and assume that there is at least one previous execution of a batch subject to the exact same set of input variables or, in the absence of such match, that a similar batch has been executed. These previous executions, which have taken place in a controlled environment, produce a state space graph. It might be the case that multiple such state space graphs are available—in that case, either one of the graphs needs to be selected beforehand and used for the remainder of the optimization process, or an exogenous mapping function (described below) can be defined to deal with multiple possible graphs.

Before starting the execution of a new batch of workflows, the control resolution must be determined. The control variable(s) resolution determines the time interval between opportunities for control adjustments. As described above, the state space graph can be summarized to represent only the relevant points in time, reducing its size.

Recall that the utility metrics determine the different aspects that are relevant to the controller. In the running example, the cost function is used, which yields a cost measured in monetary units for the usage of cores over time, to determine the cost for completing a batch of workflows.

Given the utility functions, the control resolution, and the state space graph, the optimal path (e.g., the one that substantially maximizes utility) can be precomputed for each of the states in the state space graph. To this end, a substantially shortest-path algorithm can be employed. In the present case, as the cost function configures a negative utility metric, Dijkstra's shortest-path algorithm is used to find, for each node a in the graph, the path yielding the substantially minimum cost to reach $b_{end}$. The total cost to reach $b_{end}$ from a is annotated in a.

Notice that this computation can be preprocessed. The substantially optimal paths in the state space graph 900 are thus known before the execution of a new batch starts. In the following section, the preprocessed optimal paths are leveraged into a strategy for the real-time optimization of the execution of a batch.

Online Optimization of Workflow Executions

In one or more embodiments, the snapshots obtained in real time are used for online optimization. Given a batch of workflows, snapshots of the system state are periodically collected. Such snapshots determine the current state of the batch.

An exogenous state mapping function is defined that maps the current state of the batch under execution to its closest state (e.g., its substantially most-similar state) in an endogenous state space. Note that the identification of the current state as a set of snapshots can be performed in similar manner and using the same techniques as those described in conjunction with FIGS. 1-4, which are used to compose snapshots from provenance data. Also note that in case there are multiple previous executions of the considered batch of workflows, the exogenous state mapping function selects the substantially closest state in the substantially most appropriate previous execution.

There are a number of different possible implementations of the exogenous state mapping function. Next, some possible embodiments are introduced:

1. Instantaneous Distance In Feature Space: The substantially closest state is defined to be the state in the endogenous state space that substantially minimizes the distance between its feature values and the feature values collected in the current snapshot.

2. Path Similarity in Feature Space: Consider a window of recently collected snapshots. Such sequence of recently collected snapshots should match a sequence of states in the endogenous state space. The substantially most likely sequence should be chosen, and the current state can then be determined based on the previous history.

Once the substantially most-similar state is determined, the substantially best action is selected as a function of the state space graph 900 and the associated costs. The underlying assumption is that substantially optimal actions under the currently running setup are the same as those precomputed under the endogenous state space graph 900. Once the controller applies the action, it waits for a certain period of time, determined by the configured resolution. Then, the process is repeated.

FIG. 10 illustrates exemplary pseudo code 1000 for an online workflow optimization process, according to one embodiment of the disclosure. As shown in FIG. 10, the online workflow optimization process comprises the following exemplary steps:

(1) Determine the appropriate utility functions for the intended optimization;

(2) Start the execution of a batch of workflows;

(3) Select one or more appropriate preprocessed endogenous state spaces, representing previous executions of similar workflows, over which the appropriate utility functions have been preprocessed;

(4) Until the batch completes,
   a. Collect the instantaneous provenance and telemetry information of the current batch execution;
   b. Compose snapshots from that provenance data, comprising a current state;
   c. Apply the exogenous state-mapping function over the current state, producing the substantially most-similar state in the endogenous state space graph(s);
   d. Elect the substantially best action to be performed in the current execution, leveraging the preprocessed utility functions for the substantially most-similar state; and
   e. Enact the substantially best action.

Notice that, in one or more embodiments, the exogenous mapping functions could be non-deterministic, yielding a probability distribution of similar states, instead of a single substantially most-similar state. This could be the case when the current state is partially observable, for example, or when multiple states in the state space graph are similarly appropriate candidates. In that case, the selected action can be determined, for instance, by associating weights to different states and then randomizing among the best actions at each of such states.

Figure 11:
FIG. 11 illustrates exemplary pseudo code for a simulation-based online workflow optimization process, according to an embodiment of the disclosure.

FIG. 11 illustrates exemplary pseudo code 1100 for a simulation-based online workflow optimization process, according to one embodiment of the disclosure. As shown in FIG. 11, the exemplary simulation-based online workflow optimization process initially collects the provenance data and composes snapshots from the workflow executions during Step 1. For example, the snapshots of workflows $w_1$, $w_2$, ..., $w_n$ may be collected at instant t, comprising an execution state.

Thereafter, a simulation is built during step 2 by mapping substantially similar states of workflow executions with alternative resource allocation configurations (e.g., with different numbers of cores). In the running example, number of processing cores is varied for the execution of a batch of workflows.

The state space is explored during step 3, and a substantially optimal configuration is precomputed at each state (e.g., the configuration that substantially maximizes QoS Metrics), as discussed above. In the running example, the exemplary QoS metric was substantially minimizing the total execution cost. The exemplar cost function is given by the number of allocated cores, total execution time plus a cost-to-change the configuration. The total cost-to-finish is computed at each state in the simulation and the substantially optimal choice of number of cores is assigned to each state.

During step 4, when running a new batch of workflows, the instantaneous provenance data is collected and the snapshots of the currently executing workflows are composed.

The substantially most similar state to the current execution state in the previously generated state space is identified during step 5. The configuration that would have been substantially optimal in the identified substantially most similar state is then adopted during step 6.

Examples

In one exemplary implementation, cloud-based service providers that offer infrastructure as a service (IaaS) or platforms as a service (PaaS) can leverage the contributions presented herein. Nowadays, most cloud-based providers offer virtual machines for users to run their applications. The costs of the machines vary according to their configurations. Nonetheless, users typically request such machines to run target applications, with given quality of service (QoS) requirements. For this reason, users would be willing to pay for a given QoS, irrespective of the configuration of the obtained virtual machines. In essence, the configuration may change dynamically over the execution of the application, as long as the specified QoS levels are met.

The disclosed solutions can assist cloud-based service providers in offering service level agreements (SLAs) where users pay for the execution of applications with a certain QoS. In particular, cloud-based service providers can 1) build models to predict the completion time of different applications; 2) adjust the infrastructure offered to the application to meet the QoS requirements; and 3) dynamically change the infrastructure setup as needed. The business model of the cloud-based service provider may account for cost reductions due to resource management and infrastructure optimization, while still satisfying user's needs. Such a model is referred to as Workflow as a Service (WaaS).

Infrastructure as a Service and Platform as a Service are usually assumed to be services where the cloud-based provider is aware of the infrastructure used as a mean to reach the final users' needs. Under Software as a Service, in contrast, the cloud provider is aware of the software that comprises the users' core activity. Under Workflow as a Service, the awareness of the service provider with respect to the users' activities is further increased, and the service provider establishes SLAs that account for the workflows needed by the final users. Note that if the service provider is unaware of the exact workflows executed by the users, it may still be able to identify frequent activity sets, and provide the execution of such frequent activity sets as a service.

CONCLUSION

One or more embodiments of the disclosure provide methods and apparatus for simulation-based online optimization of workflows. The foregoing applications and associated embodiments should be considered as illustrative only, and numerous other embodiments can be configured using the techniques disclosed herein, in a wide variety of different applications.

Workflows are important building blocks of modern industrial systems. In one or more embodiments, a new methodology is provided to substantially optimize the infrastructure (e.g., computation power, memory and storage) used to execute workflows, appropriate for Infrastructure as a Service environments. The disclosed methodology, in some embodiments, comprises obtaining snapshots of the workflows executed in a controlled environment, composing a state space graph with precomputed utility metrics, and using precomputed optimal paths in such state spaces to guide online resource management policies.

One or more embodiments leverage workflow snapshots into an online optimization approach based on simulation, state-similarity functions and preprocessed optimal paths. In at least some embodiments, resource allocation can be substantially optimized without use of a traditional machine learned model. Generally, the resource allocation is substantially optimized for a new execution of concurrent workflows.

In one or more embodiments, the disclosed simulation allows reasoning regarding past executions; reasoning regarding executions that did not happen; and exploration of what would have been the substantially best action in those executions. In some embodiments, the disclosed state similarity aspect allows a simulation to be composed that makes sense; and states in the simulation to be found that are similar to the current execution. In addition, the precomputation aspect optionally allows a (probable) substantially best action to be found for the current execution in a real-time manner.

It should also be understood that the disclosed techniques for workflow optimization, as described herein, can be implemented at least in part in the form of one or more software programs stored in memory and executed by a processor of a processing device such as a computer. As mentioned previously, a memory or other storage device having such program code embodied therein is an example of what is more generally referred to herein as a "computer program product."

The disclosed techniques for simulation-based online optimization of workflows may be implemented using one or more processing platforms. One or more of the processing modules or other components may therefore each run on a computer, storage device or other processing platform element. A given such element may be viewed as an example of what is more generally referred to herein as a "processing device."

As noted above, illustrative embodiments disclosed herein can provide a number of significant advantages relative to conventional arrangements. It is to be appreciated that the particular advantages described above and elsewhere herein are associated with particular illustrative embodiments and need not be present in other embodiments. Also, the particular types of information processing system features and functionality as illustrated and described herein are exemplary only, and numerous other arrangements may be used in other embodiments.

In these and other embodiments, compute services can be offered to cloud infrastructure tenants or other system users as a Platform as a Service (PaaS) offering, although numerous alternative arrangements are possible.

Some illustrative embodiments of a processing platform that may be used to implement at least a portion of an information processing system comprises cloud infrastructure including virtual machines implemented using a hypervisor that runs on physical infrastructure. The cloud infrastructure further comprises sets of applications running on respective ones of the virtual machines under the control of the hypervisor. It is also possible to use multiple hypervisors each providing a set of virtual machines using at least one underlying physical machine. Different sets of virtual machines provided by one or more hypervisors may be utilized in configuring multiple instances of various components of the system.

These and other types of cloud infrastructure can be used to provide what is also referred to herein as a multi-tenant environment. One or more system components such as analytics engine 200, or portions thereof, are illustratively implemented for use by tenants of such a multi-tenant environment.

Cloud infrastructure as disclosed herein can include cloud-based systems such as Amazon Web Services (AWS), Google Cloud Platform (GCP) and Microsoft Azure. Virtual machines provided in such systems can be used to implement at least portions of an automated workflow optimization platform in illustrative embodiments. The cloud-based systems can include object stores such as Amazon S3, GCP Cloud Storage, and Microsoft Azure Blob Storage.

In some embodiments, the cloud infrastructure additionally or alternatively comprises a plurality of containers implemented using container host devices. For example, a given container of cloud infrastructure illustratively comprises a Docker container or other type of Linux container (LXC). The containers may run on virtual machines in a multi-tenant environment, although other arrangements are possible. The containers may be utilized to implement a variety of different types of functionality within the automated workflow optimization devices. For example, containers can be used to implement respective processing devices providing compute services of a cloud-based system. Again, containers may be used in combination with other virtualization infrastructure such as virtual machines implemented using a hypervisor.

Illustrative embodiments of processing platforms will now be described in greater detail with reference to FIGS. 12 and 13. These platforms may also be used to implement at least portions of other information processing systems in other embodiments.

Figure 12:
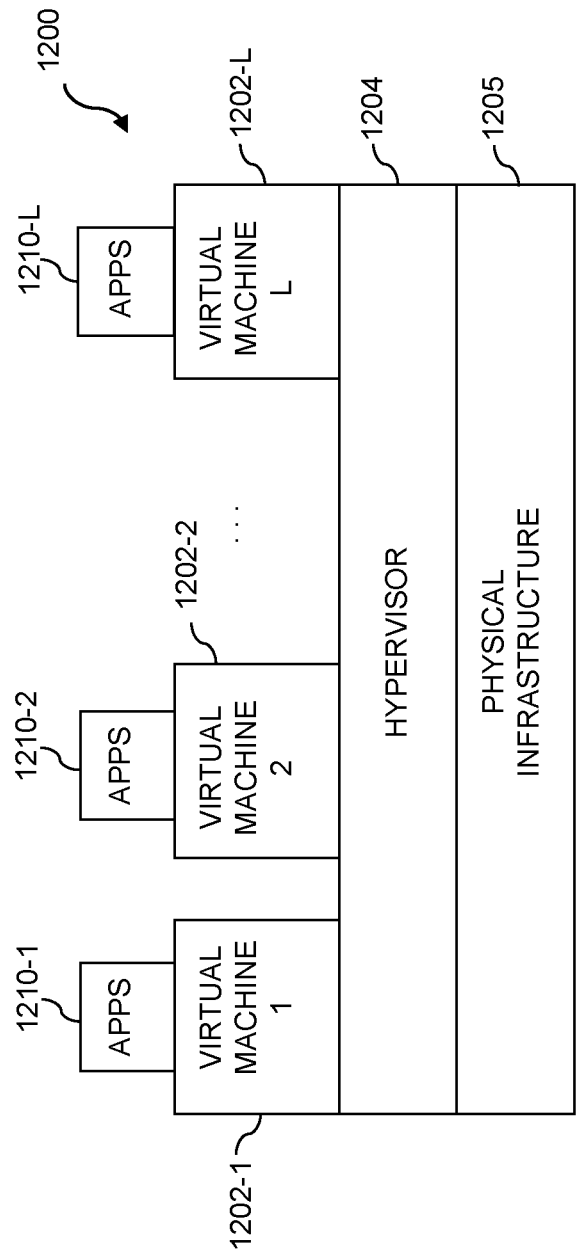
FIG. 12 illustrates an exemplary processing platform that may be used to implement at least a portion of one or more embodiments of the disclosure comprising a cloud infrastructure.

Referring now to FIG. 12, one possible processing platform that may be used to implement at least a portion of one or more embodiments of the disclosure comprises cloud infrastructure 1200. The cloud infrastructure 1200 in this exemplary processing platform comprises virtual machines (VMs) 1202-1, 1202-2, . . . 1202-L implemented using a hypervisor 1204. The hypervisor 1204 runs on physical infrastructure 1205. The cloud infrastructure 1200 further comprises sets of applications 1210-1, 1210-2, . . . 1210-L running on respective ones of the virtual machines 1202-1, 1202-2, . . . 1202-L under the control of the hypervisor 1204.

The cloud infrastructure 1200 may encompass the entire given system or only portions of that given system, such as one or more of client, servers, controllers, or computing devices in the system.

Although only a single hypervisor 1204 is shown in the embodiment of FIG. 12, the system may of course include multiple hypervisors each providing a set of virtual machines using at least one underlying physical machine. Different sets of virtual machines provided by one or more hypervisors may be utilized in configuring multiple instances of various components of the system.

An example of a commercially available hypervisor platform that may be used to implement hypervisor 1204 and possibly other portions of the system in one or more embodiments of the disclosure is the VMware® vSphere™ which may have an associated virtual infrastructure management system, such as the VMware® vCenter™. As another example, portions of a given processing platform in some embodiments can comprise converged infrastructure such as VxRail™, VxRack™, VxBlock™, or Vblock® converged infrastructure commercially available from VCE, the Virtual Computing Environment Company, now the Converged Platform and Solutions Division of Dell EMC of Hopkinton, Mass. The underlying physical machines may comprise one or more distributed processing platforms that include storage products.

Particular types of storage products that can be used in implementing a given storage system of the automated workflow optimization engine in an illustrative embodiment include VNX® and Symmetrix VMAX® storage arrays, software-defined storage products such as ScaleIO™ and ViPR®, all-flash and hybrid flash storage arrays such as Unity™, cloud storage products such as Elastic Cloud Storage (ECS), object-based storage products such as Atmos®, scale-out all-flash storage arrays such as XtremIO™, and scale-out NAS clusters comprising Isilon® platform nodes and associated accelerators, all from Dell EMC. Combinations of multiple ones of these and other storage products can also be used in implementing a given storage system in an illustrative embodiment.

In some embodiments, the cloud infrastructure additionally or alternatively comprises a plurality of containers implemented using container host devices. For example, a given container of cloud infrastructure illustratively comprises a Docker container or other type of LXC. The containers may be associated with respective tenants of a multi-tenant environment of the system, although in other embodiments a given tenant can have multiple containers. The containers may be utilized to implement a variety of different types of functionality within the system. For example, containers can be used to implement respective compute nodes or cloud storage nodes of a cloud computing and storage system. The compute nodes or storage nodes may be associated with respective cloud tenants of a multi-tenant environment of system. Containers may be used in combination with other virtualization infrastructure such as virtual machines implemented using a hypervisor.

As is apparent from the above, one or more of the processing modules or other components of the disclosed automated workflow optimization apparatus may each run on a computer, server, storage device or other processing platform element. A given such element may be viewed as an example of what is more generally referred to herein as a "processing device." The cloud infrastructure 1200 shown in FIG. 12 may represent at least a portion of one processing platform.

Figure 13:
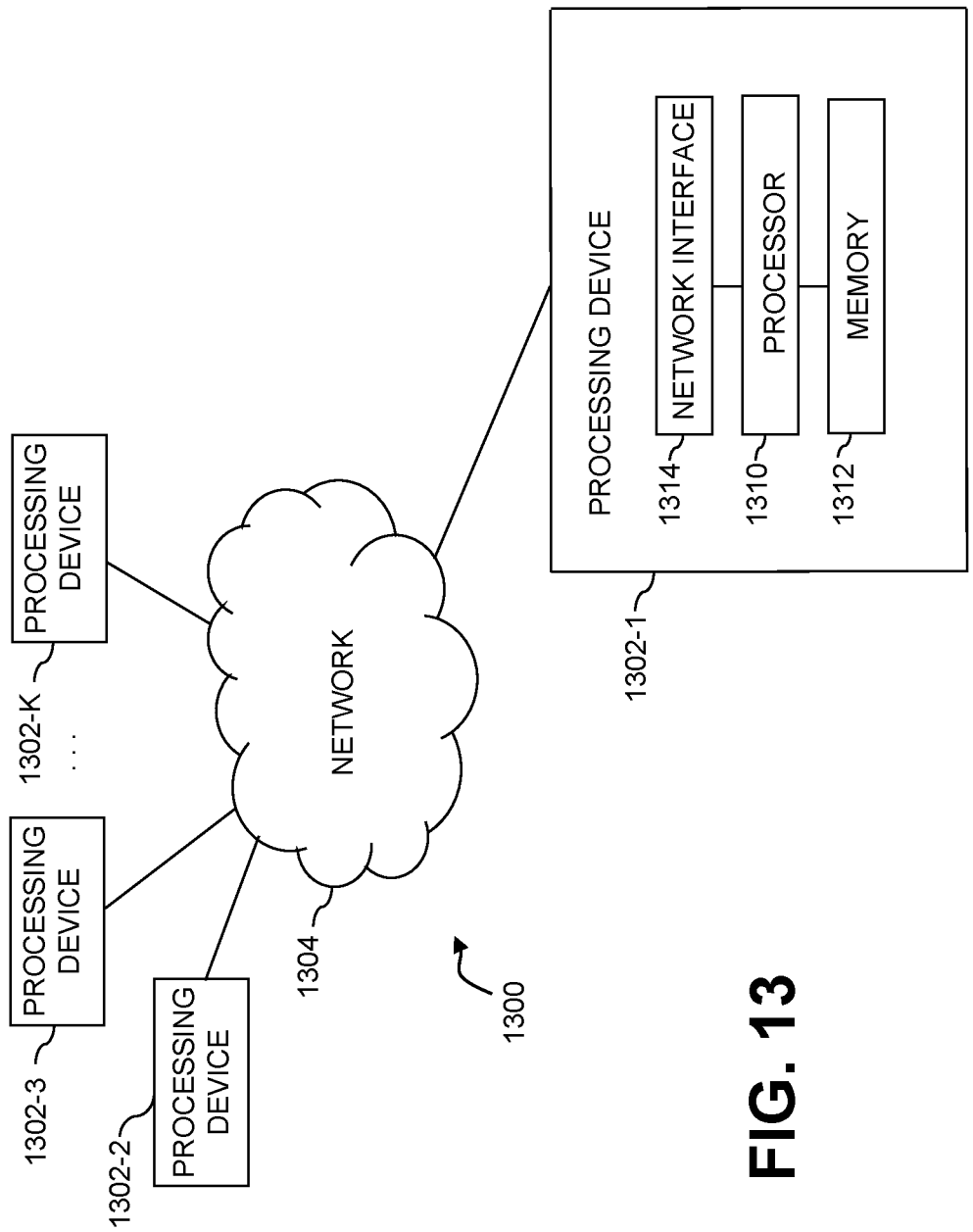
FIG. 13 illustrates another exemplary processing platform that may be used to implement at least a portion of one or more embodiments of the disclosure.

Another example of a processing platform is processing platform 1300 shown in FIG. 13. The processing platform 1300 in this embodiment comprises at least a portion of the given system and includes a plurality of processing devices, denoted 1302-1, 1302-2, 1302-3, . . . 1302-K, which communicate with one another over a network 1304. The network 1304 may comprise any type of network, such as a wireless area network (WAN), a local area network (LAN), a satellite network, a telephone or cable network, a cellular network, a wireless network such as WiFi or WiMAX, or various portions or combinations of these and other types of networks.

The processing device 1302-1 in the processing platform 1300 comprises a processor 1310 coupled to a memory 1312. The processor 1310 may comprise a microprocessor, a microcontroller, an application specific integrated circuit (ASIC), a field programmable gate array (FPGA) or other type of processing circuitry, as well as portions or combinations of such circuitry elements, and the memory 1312, which may be viewed as an example of a "processor-readable storage media" storing executable program code of one or more software programs.

Articles of manufacture comprising such processor-readable storage media are considered illustrative embodiments. A given such article of manufacture may comprise, for example, a storage array, a storage disk or an integrated circuit containing RAM, ROM or other electronic memory, or any of a wide variety of other types of computer program products. The term "article of manufacture" as used herein should be understood to exclude transitory, propagating signals. Numerous other types of computer program products comprising processor-readable storage media can be used.

Also included in the processing device 1302-1 is network interface circuitry 1314, which is used to interface the processing device with the network 1304 and other system components, and may comprise conventional transceivers.

The other processing devices 1302 of the processing platform 1300 are assumed to be configured in a manner similar to that shown for processing device 1302-1 in the figure.

Again, the particular processing platform 1300 shown in the figure is presented by way of example only, and the given system may include additional or alternative processing platforms, as well as numerous distinct processing platforms in any combination, with each such platform comprising one or more computers, storage devices or other processing devices.

Multiple elements of system may be collectively implemented on a common processing platform of the type shown in FIG. 12 or 13, or each such element may be implemented on a separate processing platform.

For example, other processing platforms used to implement illustrative embodiments can comprise different types of virtualization infrastructure, in place of or in addition to virtualization infrastructure comprising virtual machines. Such virtualization infrastructure illustratively includes container-based virtualization infrastructure configured to provide Docker containers or other types of LXCs.

As another example, portions of a given processing platform in some embodiments can comprise converged infrastructure such as VxRail™, VxRack™, VxBlock™, or Vblock® converged infrastructure commercially available from VCE, the Virtual Computing Environment Company, now the Converged Platform and Solutions Division of Dell EMC.

It should therefore be understood that in other embodiments different arrangements of additional or alternative elements may be used. At least a subset of these elements may be collectively implemented on a common processing platform, or each such element may be implemented on a separate processing platform.

Also, numerous other arrangements of computers, servers, storage devices or other components are possible in the information processing system. Such components can communicate with other elements of the information processing system over any type of network or other communication media.

As indicated previously, components of an information processing system as disclosed herein can be implemented at least in part in the form of one or more software programs stored in memory and executed by a processor of a processing device. For example, at least portions of the functionality of the flow charts and/or pseudo code shown in FIGS. 10 and 11 are illustratively implemented in the form of software running on one or more processing devices.

It should again be emphasized that the above-described embodiments are presented for purposes of illustration only. Many variations and other alternative embodiments may be used. For example, the disclosed techniques are applicable to a wide variety of other types of information processing systems. Also, the particular configurations of system and device elements and associated processing operations illustratively shown in the drawings can be varied in other embodiments. Moreover, the various assumptions made above in the course of describing the illustrative embodiments should also be viewed as exemplary rather than as requirements or limitations of the disclosure. Numerous other alternative embodiments within the scope of the appended claims will be readily apparent to those skilled in the art.

What is claimed is:

1. A method, comprising:

obtaining a state of one or more workflow executions of a plurality of concurrent workflows in a shared infrastructure environment, wherein said state comprises a plurality of provenance features of said concurrent workflows;

identifying one or more control variables from the plurality of provenance features;

obtaining a definition of one or more state similarity functions which assign a similarity score between pairs of states;

generating a simulation model of said one or more workflow executions representing a plurality of different configurations of at least one of the control variables in said one or more workflow executions of the concurrent workflows by mapping states with a substantially highest similarity given by said one or more state similarity functions;

obtaining at least one utility function that assigns a utility score to one or more of the states in said simulation model;

determining a configuration of at least one control variable that substantially maximizes said utility score for one or more states in the simulation model; and performing the following steps, using at least one processing device, in response to an execution of a plurality of new concurrent workflows:

collecting instantaneous provenance features of said new concurrent workflows;

obtaining a current state of said execution comprised of said instantaneous provenance features;

identifying a substantially most similar state with one of the determined configurations of said at least one control variable in the simulation model with a substantially highest similarity to said current state given by said one or more state similarity functions;

adjusting the configuration of the at least one control variable of the execution to substantially match the corresponding configuration of said at least one control variable of the substantially most similar state; and initiating an update of an allocation of at least one resource in the shared infrastructure environment based at least in part on the adjusted configuration of the at least one control variable.

2. The method of claim 1, wherein the state further comprises time-stamped telemetry information of said shared infrastructure environment.

3. The method of claim 2, wherein the state further comprises features related to an aggregate context provenance of the concurrent workflows.

4. The method of claim 2, wherein the state further comprises an indication of the value assigned to the at least one control variable during a given execution of the concurrent workflows.

5. The method of claim 1, wherein the simulation model comprises a graph, where nodes in the graph are comprised of the states in the simulation model, and wherein the step of determining the configuration of said at least one control variable that substantially maximizes said utility score for one or more states in the simulation model further comprises determining a path that substantially maximizes said at least one utility function for one or more nodes in the graph.

6. The method of claim 5, wherein said graph comprises only nodes representing fixed time steps larger than a predetermined value.

7. The method of claim 1, wherein the different configurations of the at least one of the control variables in said one or more workflow executions of the concurrent workflows comprise a plurality of resource allocation configurations of the at least one control variable.

8. The method of claim 1, wherein an exogenous state mapping function maps the current state of the new concurrent workflows to the substantially most similar state.

9. The method of claim 1, further comprising the step of generating one or more sample paths that were not observed in one or more controlled experiments.

10. A system, comprising:

a memory; and at least one processing device, coupled to the memory, operative to implement the following steps:

obtaining a state of one or more workflow executions of a plurality of concurrent workflows in a shared infrastructure environment, wherein said state comprises a plurality of provenance features of said concurrent workflows;

identifying one or more control variables from the plurality of provenance features;

obtaining a definition of one or more state similarity functions which assign a similarity score between pairs of states;

generating a simulation model of said one or more workflow executions representing a plurality of different configurations of at least one of the control variables in said one or more workflow executions of the concurrent workflows by mapping states with a substantially highest similarity given by said one or more state similarity functions;

obtaining at least one utility function that assigns a utility score to one or more of the states in said simulation model;

determining a configuration of at least one control variable that substantially maximizes said utility score for one or more states in the simulation model; and performing the following steps, using the at least one processing device, in response to an execution of a plurality of new concurrent workflows:

collecting instantaneous provenance features of said new concurrent workflows;

obtaining a current state of said execution comprised of said instantaneous provenance features;

identifying a substantially most similar state with one of the determined configurations of said at least one control variable in the simulation model with a substantially highest similarity to said current state given by said one or more state similarity functions;

adjusting the configuration of the at least one control variable of the execution to substantially match the corresponding configuration of said at least one control variable of the substantially most similar state; and initiating an update of an allocation of at least one resource in the shared infrastructure environment based at least in part on the adjusted configuration of the at least one control variable.

11. The system of claim 10, wherein the state further comprises time-stamped telemetry information of said shared infrastructure environment.

12. The system of claim 11, wherein the state further comprises features related to an aggregate context provenance of the concurrent workflows.

13. The system of claim 11, wherein the state further comprises an indication of the value assigned to the at least one control variable during a given execution of the concurrent workflows.

14. The system of claim 10, wherein the simulation model comprises a graph, where nodes in the graph are comprised of the states in the simulation model, and wherein the step of determining the configuration of said at least one control variable that substantially maximizes said utility score for one or more states in the simulation model further comprises determining a path that substantially maximizes said at least one utility function for one or more nodes in the graph.

15. The system of claim 14, wherein said graph comprises only nodes representing fixed time steps larger than a predetermined value.

16. The system of claim 10, wherein the different configurations of the at least one of the control variables in said one or more workflow executions of the concurrent workflows comprise a plurality of resource allocation configurations of the at least one control variable.

17. The system of claim 10, wherein an exogenous state mapping function maps the current state of the new concurrent workflows to the substantially most similar state.

18. The system of claim 10, further comprising the step of generating one or more sample paths that were not observed in one or more controlled experiments.

19. A computer program product, comprising a non-transitory machine-readable storage medium having encoded therein executable code of one or more software programs, wherein the one or more software programs when executed by at least one processing device perform the following steps:
obtaining a state of one or more workflow executions of a plurality of concurrent workflows in a shared infrastructure environment, wherein said state comprises a plurality of provenance features of said concurrent workflows;
identifying one or more control variables from the plurality of provenance features;
obtaining a definition of one or more state similarity functions which assign a similarity score between pairs of states;
generating a simulation model of said one or more workflow executions representing a plurality of different configurations of at least one of the control variables in said one or more workflow executions of the concurrent workflows by mapping states with a substantially highest similarity given by said one or more state similarity functions;
obtaining at least one utility function that assigns a utility score to one or more of the states in said simulation model;
determining a configuration of at least one control variable that substantially maximizes said utility score for one or more states in the simulation model; and
performing the following steps, using at least one processing device, in response to an execution of a plurality of new concurrent workflows:
collecting instantaneous provenance features of said new concurrent workflows;
obtaining a current state of said execution comprised of said instantaneous provenance features;
identifying a substantially most similar state with one of the determined configurations of said at least one control variable in the simulation model with a substantially highest similarity to said current state given by said one or more state similarity functions;
adjusting the configuration of the at least one control variable of the execution to substantially match the corresponding configuration of said at least one control variable of the substantially most similar state; and
initiating an update of an allocation of at least one resource in the shared infrastructure environment based at least in part on the adjusted configuration of the at least one control variable.

20. The computer program product of claim 19, wherein the simulation model comprises a graph, where nodes in the graph are comprised of the states in the simulation model, and wherein the step of determining the configuration of said at least one control variable that substantially maximizes said utility score for one or more states in the simulation model further comprises determining a path that substantially maximizes said at least one utility function for one or more nodes in the graph.

* * * * *